United States Patent
Nguyen et al.

(10) Patent No.: US 6,680,164 B2
(45) Date of Patent: Jan. 20, 2004

(54) SOLVENT FREE PHOTORESIST STRIP AND RESIDUE REMOVAL PROCESSING FOR POST ETCHING OF LOW-K FILMS

(75) Inventors: Huong Thanh Nguyen, San Ramon, CA (US); Mark Naoshi Kawaguchi, Palo Alto, CA (US); Mehul B. Naik, San Jose, CA (US); Li-Qun Xia, Santa Clara, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 139 days.

(21) Appl. No.: 10/006,563

(22) Filed: Nov. 30, 2001

(65) Prior Publication Data
US 2003/0104320 A1 Jun. 5, 2003

(51) Int. Cl.⁷ .................................................. G03F 7/42
(52) U.S. Cl. ........................................ 430/329; 134/1.1
(58) Field of Search ................................. 430/329, 311, 430/313; 134/1, 1.1, 1.2, 1.3; 438/725, 906; 216/41, 70

(56) References Cited

U.S. PATENT DOCUMENTS

| | | | | |
|---|---|---|---|---|
| 4,028,155 | A | 6/1977 | Jacob | 156/643 |
| 4,357,203 | A | 11/1982 | Zelez | 156/643 |
| 5,660,682 | A | 8/1997 | Zhao et al. | 438/715 |
| 5,681,780 | A | 10/1997 | Mihara et al. | 437/228 |
| 5,811,358 | A | 9/1998 | Tseng et al. | 438/725 |
| 6,024,045 | A | 2/2000 | Kikuchi et al. | 118/723 |
| 6,030,901 | A | 2/2000 | Hopper et al. | 438/711 |
| 6,037,255 | A | 3/2000 | Hussein et al. | 438/675 |
| 6,043,004 | A | 3/2000 | Kurimoto | 430/329 |
| 6,046,115 | A | 4/2000 | Molloy et al. | 438/710 |
| 6,062,237 | A | 5/2000 | Brown et al. | 134/1.1 |
| 6,074,569 | A | 6/2000 | Kiziloglu et al. | 216/62 |
| 6,124,213 | A | 9/2000 | Usami et al. | 438/710 |
| 6,130,166 | A | 10/2000 | Yeh | 438/710 |
| 6,214,728 | B1 | 4/2001 | Chan et al. | 438/678 |

*Primary Examiner*—Kathleen Duda
(74) *Attorney, Agent, or Firm*—Moser, Patterson & Sheridan

(57) ABSTRACT

A photoresist or a residue of the photoresist may by removed by the hydrogen and water plasma mixture. The process may be performed at a temperature range between about 150° C. and about 450° C., preferably about 250° C., and a power range between about 500 W and about 3000 W, preferably about 1400 W.

44 Claims, No Drawings

SOLVENT FREE PHOTORESIST STRIP AND RESIDUE REMOVAL PROCESSING FOR POST ETCHING OF LOW-K FILMS

BACKGROUND OF THE INVENTION

1. Field of the Invention

Aspects of the present invention generally relate to a photoresist strip and residue removal process.

2. Description of the Related Art

As feature sizes have become smaller and multilevel metallization commonplace in integrated circuits, low dielectric constant films have become increasingly important. Generally, smaller features and longer interconnects cause the capacitance between metal lines to increase. Increases in interconnect capacitance may lead to resistance-capacitance ("RC") delay time and hamper the circuit's efficiency. Dielectric films with a low dielectric constant have been found to reduce the interconnect capacitance and reduce the device power consumption.

Many approaches to lower dielectric constants have been proposed. One of the more promising solutions is using carbon containing inter-metal dielectric ("IMD") films. An example of carbon containing IMD films is an IMD film deposited from organosilicon compounds such as organosilanes and organosiloxanes. The resulting carbon doped oxide films generally have dielectric constants ("k") of less than 4.0 and in some cases less than 3.0. These films are generally softer than conventional dielectric films and more porous, having molecular sized holes with diameters between about 5–7 angstroms.

One challenge the industry faces in employing these low-k films is preventing the dielectric constant from increasing as a result of subsequent processing of the wafer, e.g., by oxidizing carbon in the low-k film during the removal of a photoresist. Generally, removal of the photoresist is part of a multi-step pattern transfer process known as photolithography. Typically, the dielectric layer is coated with a light sensitive material called a photoresist. An image of a mask containing the desired pattern is transferred to the photoresist. The photoresist is developed to define the desired pattern in the photoresist. Thereafter, the pattern is transferred from the photoresist to the dielectric layer by an etch process that selectively removes dielectric relative to the photoresist. After the dielectric layer is patterned, the photoresist has served its purpose and is usually removed.

Conventional photoresist removal methods include dry stripping and wet clean processes. The wet clean process typically contains solvents designed to remove inorganic residues and contaminants such as hydroxylamines or amines. The dry stripping process, also known as ashing, typically uses oxygen plasma to react with the photoresist to form volatile gases that are removed from the chamber by a vacuum pump. Dry processes have a number of advantages over the wet strip process including the reduced cost of using and handling chemical solvents. However, conventional ashing processes are ineffective for removing etch residues and sputtered metal by-products. As a result, the conventional photoresist removal sequence typically consists of a combination of a dry strip process using oxygen to remove the bulk of the photoresist layer and a wet clean process to remove the residues and metal contaminants. The conventional sequence further includes an anneal step to remove any moisture resulting from the wet strip.

It has been found that the conventional photoresist removal sequence negatively affects the low-k film by increasing its dielectric constant and/or causing via poisoning. The mechanism for the negative effect is not well understood. Generally, films that are more porous tend to have a lower dielectric constant. It is believed that the reagents used in the wet clean process may fill the molecular holes of the low-k film and effectively increase the dielectric constant. For example, a wet clean process performed on a doped silicon oxide low k film using a solvent such as EKC 265 showed moisture trapped in the film. Additionally, it is known that moisture increases a film's dielectric constant. Further, moisture or solvent trapped in the film may react with the dielectric. The reagents soaked into the low-k film may outgas in subsequent high temperature processing, leading to metal contact resistance problems. Furthermore, via holes may be partially filled with residue resulting from interactions between the post-etch residue and the solvent. It is believed that some or all of these factors contribute to the increase of the low-k film's dielectric constant.

Therefore, there is need for a method to strip photoresist deposited on a low-k film with minimal effect on the dielectric constant of the low-k material and the integrity of the via. It would be desirable for the method to eliminate the wet strip process to lower cost and avoid solvent handling.

SUMMARY OF THE INVENTION

In one aspect of the invention, a method for stripping photoresist on a low-k film is provided. Generally, after the bulk of the photoresist is removed using a dry strip process, the residue remaining on the low-k film may be removed by a plasma mixture of hydrogen and water. The method provides a dry strip process to remove the photoresist from the low-k film thereby eliminating the need for a wet clean step.

In another aspect of the invention, the photoresist and the residue may by removed by the hydrogen and water plasma mixture in a single step. The process may be performed at a temperature range between about 150° C. and about 450° C., preferably about 250° C., and a power range between about 500 W and about 3000 W, preferably about 1400 W.

In still another aspect of the invention, before the photoresist is removed, etch by-products resulting from etching the photoresist may be removed by a chemical additive and either a hydrogen and water plasma mixture or an oxygen plasma. The chemical additive may be a fluorine containing gas, such as $CF_4$, in the amount of about 0.1% and about 10% of total volume, preferably about 2%. Alternatively, a physical additive such as a soft bias may be applied prior to the bulk photoresist step to remove the etch by-products. After etch by-product removal, the photoresist is stripped using a plasma mixture of hydrogen and water.

In still another aspect of the invention, after the photoresist and residue are removed, the low-k film is processed prior to subsequent processing to improve the film's properties. The processing includes exposing the low-k film to the hydrogen and water plasma mixture at a power range between about 100 W and about 1000 W, preferably about 500 W, and a temperature range between about 150° C. and about 450° C., preferably about 250° C.

In still another aspect of the invention, stripping the photoresist and improving the low-k film properties are performed in a one step process by exposing the photoresist to a plasma mixture of hydrogen and water at a power range between about 300 W and about 3000 W, preferably 500 W, and a temperature range between about 150° C. and about 450° C., preferably about 250° C. The photoresist is exposed to the plasma for about 30 seconds and about 180 seconds, preferably between about 45 seconds and about 120 seconds, and most preferably about 60 seconds.

DETAILED DESCRIPTION OF THE PREFERRED EMBODIMENT

The present invention provides a method for photoresist strip and residue removal on a low-k film. In particular, the invention removes photoresist and residue with minimal effect on the dielectric constant of the low-k film and the integrity of the via. Furthermore, the embodiments of the invention provide a dry process for removing photoresist and residue on low-k films.

The exemplary embodiments of the present invention are directed to a 200 mm sized wafer. The exemplary embodiments are provided only to illustrate the present invention and should not be used to limit the scope of the present invention. The present invention may be applied to wafers of other known size without departing from the scopes of the present invention. For example, the embodiments of the present invention may be applied to a 300 mm sized wafer by increasing the process parameters such as the plasma flow and power ranges by about 2.25 times higher than the ranges for a 200 mm wafer. Further, the aspects of the present invention may be applied to conventional dielectric films having a relatively higher dielectric constant.

First Embodiment

In one embodiment of the present invention, the photoresist is stripped by a downstream plasma mixture of hydrogen and water. The hydrogen is supplied at a flow rate between about 1000 sccm and about 5000 sccm, preferably about 3000 sccm, and a minority component of water vapor is supplied at a flow rate between about 10 sccm and about 1000 sccm, preferably about 150 sccm. Initially, a downstream plasma of the gas mixture is generated in the plasma generating zone of a downstream plasma strip chamber. Thereafter, the excited gas mixture moves into a processing zone of the strip chamber for processing.

The stripping conditions include a temperature between about 150° C. and about 450° C., preferably about 250° C., and a power between about 500 W and about 3000 W, preferably about 1400 W. The photoresist is exposed to the plasma from about 30 seconds to about 180 seconds, preferably about 45 seconds to 120 seconds, and most preferably about 60 seconds.

It is believed that the hydrogen radicals in the plasma remove hydrogen from the photoresist and generate free-radical sites, which react further to fragment the photoresist. Further, the addition of a minority component of water vapor increases the concentration of the hydrogen radical which enhances the stripping reaction to provide acceptable reaction rates.

This step also removes residue generated from the process. Although the mechanism for residue removal is not well understood, it is believe that the organic components of the residue are removed in the same manner as the photoresist. The inorganic material in the residue is primarily $Si_xO_y$, which may be reduced by the hydrogen and made into volatile $SiH_4$.

Following photoresist and residue removal, the low-k film may optionally be treated by the same plasma mixture to improve the film's properties for subsequent processing. One advantage of this treatment step is that it may be integrated in the same chamber with the photoresist removal process. The plasma power in this step is between about 100 W and about 1000 W, preferably about 500 W. The process temperature may be maintained between about 150° C. and about 450° C., preferably about 250° C., and the process time may range from between about 30 seconds to about 240 seconds, preferably about 60 seconds. The film treatment step anneals and passivates the low-k film. It is believed that the treatment reduces defects on the film caused by the photoresist removal step by repairing the material to create a more ordered structure. Consequently, the embodiment of the present invention strips the photoresist with minimal effect on the dielectric constant of the low-k film and the via, and eliminates the wet strip process.

In the embodiments described, a downstream plasma is preferred over a plasma generated in the processing zone. Generally, a downstream plasma is generated by a microwave or inductively coupled energy source in an area remote to the processing zone. For example, a downstream plasma strip chamber will typically have two zones, a plasma generating zone connected to a processing zone. The processing gas is initially introduced into the plasma generating zone where a plasma generating source will deliver energy to generate the plasma. Thereafter, the plasma travels into the processing zone and distributed over the substrate. Downstream plasma poses a smaller risk of plasma induced device damage because the ions recombine quickly leaving only radicals to enter the processing area. Additionally, downstream plasma chambers do not add significant metal contamination that is typically seen in etch chambers where sputtering of chamber materials occurs. However, it must be noted that a plasma generated in the processing area may also be used without departing from the scope of the present invention.

EXAMPLE 1

After a feature is etched, a 200 mm substrate comprising a low-k film is delivered in vacuum from an etch chamber to a downstream plasma strip chamber for photoresist removal. A hydrogen and water processing gas is delivered into the plasma generating zone of the strip chamber. The processing gas comprises hydrogen supplied at about 3000 sccm and water vapor supplied at about 150 sccm. After the plasma is generated, it is introduced into the processing zone of the strip chamber. The strip process proceeds at about 1400 W and about 250° C. for about 60 seconds. After the photoresist is removed, the same plasma mixture is used to treat the low-k film before subsequent processing. The low-k film is exposed to the plasma for about 60 seconds at a reduced power of about 500 W. The process effectively stripped the photoresist on the low-k film with minimal effect on the dielectric constant.

Second Embodiment

In another embodiment of the present invention, the bulk of the photoresist is stripped by an oxygen based plasma. The oxygen based plasma can be a downstream plasma or a bias plasma. Stripping the bulk photoresist using a oxygen based bias plasma requires a low wafer temperature in the range of about 0° C. and about 100° C., preferably about 20° C., and a bias power range between about 50 W and about 500 W, preferably about 200 W. The chamber pressure is between about 50 mT and 500 mT, preferably about 80 mT. The oxygen plasma is supplied at a flow rate beween about 100 sccm and about 1000 sccm, preferably about 250 sccm. The photoresist is exposed to the oxygen plasma for about 20 seconds to about 120 seconds, preferably about 30 seconds and 60 seconds. It is believed that the oxygen plasma removes the photoresist by reacting with the organic material in the photoresist. Specifically, the oxygen radicals in the plasma abstract hydrogen from the organic based photoresist and generate a free radical site. Oxygen radicals react further with this free radical site to further breakdown the photoresist. The oxygen based bias plasma cleaning step can be incorporated as a post-etch step in the etch chamber to increase throughput and decrease manufacturing cost. In another embodiment, nitrogen may be added to the oxygen plasma. For example, nitrogen may be added to constitute about 5–30% of the total plasma volume.

Alternatively, the bulk photoresist can be stripped using a downstream oxygen based plasma in a temperature range of about 150° C. to about 450° C., preferably about 250° C., a high power range of about 500 W to about 3000 W, preferably about 1400 W, and a pressure range of about 500 mT and to about 5000 mT, preferably about 2000 mT. The oxygen flow rate is between about 1000 sccm and about 5000 sccm, preferably about 3500 sccm. The photoresist is exposed to the oxygen plasma for about 20 seconds to about 120 seconds, preferably about 30 seconds and 60 seconds. In another embodiment, nitrogen may be added to the oxygen based plasma to make up about 3–15% of the total plasma volume.

Any remaining residues are removed in a subsequent plasma treatment step using a downstream plasma mixture of hydrogen and water. The hydrogen is supplied at a flow rate between about 1000 sccm and about 5000 sccm, preferably about 3000 sccm, and water vapor is supplied at a flow rate between about 10 sccm and about 1000 sccm, preferably about 150 sccm. The process is performed in a temperature range between about 150° C. and about 450° C., preferably about 250° C., and a power range between about 500 W and about 3000 W, preferably about 1400 W. The low-k film is exposed to the plasma mixture for about 30 seconds to about 180 seconds, preferably between about 45 seconds and about 120 sec, most preferably about 60 seconds, to remove the residue. The residues are removed without performing a wet clean process.

Preferably, following photoresist removal, the low-k film is treated by the same plasma mixture to improve the film's properties for subsequent processing. The plasma power in this step is supplied in a range between about 100 W and about 1000 W, preferably about 500 W. The process temperature may be maintained between about 150° C. and about 450° C., preferably about 250° C., and the process time may range from between about 30 seconds to about 240 seconds, preferably about 60 seconds. Consequently, the present invention strips the photoresist with minimal effect on the dielectric constant of the low-k film and the via, and eliminates the wet strip process.

EXAMPLE 2

After a feature is etched, a substrate comprising a low-k film is delivered to a process chamber for photoresist removal. An oxygen and nitrogen plasma mixture is generated in the process chamber by introducing oxygen at about 200 sccm and nitrogen at about 50 sccm. The chamber is biased at about 200 W and maintained at about 20° C. and about 80 mTorr. The substrate is exposed to the plasma mixture for about 80 seconds to remove the bulk of the photoresist. Thereafter, the substrate is transferred to a downstream plasma strip chamber. Any residue remaining on the low-k film is removed by a downstream plasma mixture of hydrogen and water at a power of about 1400 W and a temperature of about 250° C. The film is exposed to the plasma for about 60 seconds. Thereafter, the same plasma mixture is used to treat the low-k film before subsequent processing. The low-k film is exposed to the plasma for about 60 seconds at a reduced power of about 500 W.

EXAMPLE 3

Alternatively, a photoresist removal process using oxygen based plasma can be performed in a downstream plasma strip chamber in two steps. Initially, a downstream plasma comprising oxygen supplied at 3000 sccm and nitrogen supplied at 300 sccm is delivered to the chamber. The strip chamber operates at about 1400 W and 250° C. The substrate is exposed to the plasma for about 20 seconds.

Any residue remaining on the low-k film is removed by a downstream plasma mixture of hydrogen and water at a power of about 1400 W and a temperature of about 250° C. The film is exposed to the plasma for about 60 seconds. Thereafter, the same plasma mixture is used to treat the low-k film before subsequent processing. The low-k film is exposed to the plasma for about 60 seconds at a reduced power of about 500 W. The process effectively removes the photoresist with minimal effect on the dielectric constant.

Third Embodiment

In another embodiment, the present invention may also remove the etch by-product on the photoresist after etching a feature. In conventional photolithography, a desired pattern is defined in the photoresist for transfer to the surface layer. An etch process is used to transfer the pattern from the photoresist to the surface layer. This etch process typically results in by-products on the photoresist that requires removal. According to the present invention, the etch by-product may be removed by a plasma mixture of hydrogen, water, and a physical or chemical additive. Alternatively, the etch by-product may be removed by an oxygen plasma and a physical or chemical additive. The chemical additive may be a fluorine containing gas such as $CF_4$ of about 0.1% and about 10% of total flow, preferably about 1% and about 3%. The strip process with the chemical additive may be performed at a temperature range between about 0° C. and about 450° C., preferably about 250° C. Other fluorine containing gases that are suitable as a chemical additive include $CH_3F$, $CHF_3$, $CH_2F_2$, $C_2F_6$, $C_4F_8$, $C_3F_6$, and $NF_3$.

Alternatively, a physical additive such as a soft bias may be applied prior to the bulk strip step to remove the etch by-products at a power range between about 50 W and about 500 W, preferably about 200 W, and a temperature range between about 0° C. and about 450° C., preferably between about 0° C. and about 100° C., and most preferably about 20° C. The process pressure ranges between about 500 mT and about 5000 mT, preferably about 1000 mT and the substrate is process for about 10 seconds to 120 seconds, preferably about 15 seconds to about 30 seconds. Processing the substrate with soft bias provides a high flux of ions to the substrate with minimal bombardment energy. In both the chemical and physical embodiments, a low temperature is preferred for enhanced residue removal.

After the etch by-product is removed, the photoresist may be stripped by a downstream plasma mixture of hydrogen and water. The hydrogen is supplied at a flow rate between about 1000 sccm and about 5000 sccm, preferably about 3000 sccm, and a minority component of water vapor is supplied at a flow rate between about 10 sccm and about 1000 sccm, preferably about 150 sccm. The stripping process temperature ranges between about 150° C. and about 450° C., preferably about 250° C., and the power ranges between about 500 W and about 3000 W, preferably about 1400 W. The photoresist is exposed to the plasma from about 30 seconds to about 180 seconds, preferably about 45 seconds to about 120 seconds, and most preferably about 60 seconds. The hydrogen/water plasma will not only remove the bulk of the photoresist, but also remove any remaining residue.

Preferably, following photoresist removal, the low-k film is treated by the same plasma mixture to improve the film's properties for subsequent processing. The plasma power in this step is supplied in a range between about 100 W and about 1000 W, preferably about 500 W. The process temperature may be maintained between about 150° C. and about 450° C., preferably about 250° C., and the process time may range from between about 30 seconds to about 240 seconds, preferably about 60 seconds.

EXAMPLE 4

After a feature is etched, the etch by-product is removed by an oxygen and $CF_4$ plasma mixture. The oxygen is introduced at about 400 sccm and $CF_4$ is introduced at about 10 sccm. The plasma is biased at about 200 W and maintained at about 20° C. and about 80 mTorr. The substrate was exposed to the plasma for about 10 seconds.

Thereafter, the substrate is transferred to a downstream plasma strip chamber. A hydrogen and water plasma mixture is generated and delivered into the processing area. The plasma mixture is generated from a gas mixture of hydrogen supplied at about 3000 sccm and water vapor supplied at about 150 sccm. The strip process proceeds at about 1400 W and about 250° C. for about 60 seconds. After the photoresist is removed, the same plasma mixture is used to treat the low-k film before subsequent processing. The low-k film is exposed to the plasma for about 60 seconds at a reduced power of about 500 W. The process effectively stripped the photoresist on the low-k film with minimal effect on the dielectric constant.

EXAMPLE 5

Alternatively, after a feature is etched, the etch by-product is removed by an oxygen and nitrogen plasma mixture with soft bias. The oxygen is introduced at about 400 sccm and nitrogen is introduced at about 50 sccm. The plasma is biased at about 200 W and maintained at about 20° C. and about 1000 mTorr. The substrate was exposed to the plasma for about 10 seconds.

Thereafter, the substrate is transferred to a downstream plasma strip chamber where a hydrogen and water plasma mixture generated remotely and delivered into the processing area. The plasma mixture is generated from a gas mixture of hydrogen supplied at about 3000 sccm and water vapor supplied at about 150 sccm. The strip process proceeds at about 1400 W and about 250° C. for about 60 seconds. After the photoresist is removed, the same plasma mixture is used to treat the low-k film before subsequent processing. The low-k film is exposed to the plasma for about 60 seconds at a reduced power of about 500 W. The process effectively stripped the photoresist on the low-k film with minimal effect on the dielectric constant.

Fourth Embodiment

In yet another embodiment of the invention, the photoresist is stripped by a downstream plasma mixture of hydrogen and water. The hydrogen is supplied at a flow rate between about 1000 sccm and about 10,000 sccm, preferably 3000 sccm, and water is supplied at a flow rate between about 10 sccm and about 1000 sccm, preferably about 50 sccm. The stripping process is performed in a temperature range between about 150° C. and about 450° C., preferably about 250° C., and a power range between about 300 W and 3000 W, preferably about 500 W. The photoresist is exposed to the plasma for about 30 seconds to about 180 seconds, preferably about 45 seconds to about 120 seconds, and most preferably about 60 seconds. The hydrogen/water plasma will not only remove the bulk of the photoresist, but also remove any remaining residue. Consequently, the dry strip process of this embodiment integrates the resist removal, residue removal, and film treatment into a single process step.

EXAMPLE 6

After a feature is etched, a substrate comprising a low-k film is delivered to a downstream plasma strip chamber for photoresist removal. A hydrogen and water plasma mixture is generated and delivered into the strip chamber. The plasma mixture is generated from a gas mixture of hydrogen supplied at about 3000 sccm and water vapor supplied at about 50 sccm. The strip process proceeds at about 500 W and about 250° C. for about 120 seconds. The process effectively stripped the photoresist on the low-k film in one step with minimal effect on the dielectric constant.

While the foregoing is directed to embodiments of the present invention, other and further embodiments of the invention may be devised without departing from the basic scope thereof, and the scope thereof is determined by the claims that follow.

What is claimed is:

1. A method for processing a dielectric film, comprising:
   depositing a photoresist on the dielectric film; and
   removing the photoresist using a plasma produced from a mixture of hydrogen gas and water.

2. The method of claim 1, wherein the hydrogen gas is supplied at a flow rate between about 1000 sccm and about 5000 sccm and the water is supplied at a flow rate between about 10 sccm and about 1000 sccm.

3. The method of claim 1, wherein the plasma is maintained at a temperature between about 150° C. and 450° C.

4. The method of claim 1, wherein the plasma is maintained at a power between about 500 W and 3000 W.

5. The method of claim 1, wherein the dielectric film is exposed to the plasma for between about 30 seconds and 180 seconds.

6. A method for processing a low-k film, comprising:
   depositing a photoresist on the low-k film;
   patterning the photoresist;
   etching the photoresist; and
   removing a residue of the photoresist using a plasma produced from a mixture of hydrogen gas and water.

7. The method of claim 6, wherein the hydrogen gas is supplied at a flow rate between about 1000 sccm and about 5000 sccm and the water is supplied at a flow rate between about 10 sccm and about 1000 sccm.

8. The method of claim 6, wherein the plasma is maintained at a temperature between about 150° C. and 450° C.

9. The method of claim 6, wherein the plasma is maintained at a power between about 500 W and 3000 W.

10. The method of claim 6, wherein the low-k film is exposed to the plasma for between about 30 seconds and 180 seconds.

11. The method of claim 6, further comprising exposing the low-k film to the plasma at power between 100 W and 1000 W after removing the residue.

12. The method of claim 11, wherein the low-k film is exposed to the plasma at a power between 100 W and 1000 W for a period of about 30 seconds to 240 seconds.

13. The method of claim 6, wherein a portion of the photoresist is removed using a plasma comprising oxygen.

14. The method of claim 13, wherein the oxygen plasma is supplied at a flow rate between about 100 sccm and 1000 sccm.

15. The method of claim 13, wherein the oxygen plasma is biased between about 50 W and 500 W.

16. The method of claim 13, wherein the oxygen plasma is maintained at a temperature between about 0° C. and 100° C.

17. The method of claim 13, wherein the oxygen plasma is a downstream oxygen plasma.

18. The method of claim 17, wherein the oxygen plasma is supplied at a flow rate between about 1000 sccm and 5000 sccm.

19. The method of claim 17, wherein the downstream oxygen plasma power is between about 500 W and 3000 W.

20. The method of claim 17, wherein the oxygen plasma is maintained at a temperature between about 150° C. and 450° C.

21. The method of claim 17, wherein the plasma for removing photoresist further comprises nitrogen.

22. The method of claim 21, wherein the nitrogen is about 5–30% of the total plasma volume.

23. The method of claim 13, further comprising exposing the low-k film to the hydrogen gas and water plasma maintained at a power between 100 W and 1000 W after removing the residue.

24. The method of claim 23, wherein the low-k film is exposed to the hydrogen gas and water plasma for a period of about 30 seconds to 240 seconds.

25. The method of claim 6, further comprise removing an etch by-product after etching the photoresist.

26. The method of claim 25, wherein the etc by-product is removed using a plasma comprising a fluorine containing gas.

27. The method of claim 26, wherein the fluorine containing gas is selected from the group consisting of $CF_4$, $CH_3F$, $CHF_3$, $CH_2F_2$, $C_2F_6$, $C_4F_8$, $C_3F_6$, $NF_3$, and combinations thereof.

28. The method of claim 26, wherein the plasma for etch by-product removal further comprises hydrogen and water.

29. The method of claim 26, wherein the plasma for etch by-product removal further comprises oxygen.

30. The method of claim 29, wherein the fluorine containing gas is between about 0.1% and about 10% of the total plasma volume.

31. The method of claim 25, wherein the etc by-product is removed using soft bias.

32. The method of claim 31, wherein the soft bias comprises maintaining a power between about 100 W and 1000 W.

33. The method of claim 31, wherein the soft bias is maintained at a temperature between about 0° C. and about 100° W.

34. The method of claim 31, wherein the soft bias is maintained at a pressure between about 500 mT and 5000 mT.

35. The method of claim 25, wherein the plasma is a downstream plasma.

36. The method of claim 25, further comprising exposing the low-k film to the hydrogen gas and water plasma mixture maintained at a power between 100 W and 1000 W after residue removal.

37. The method of claim 36, wherein the low-k film is exposed to the hydrogen gas and water plasma mixture for a period of about 30 seconds to 240 seconds.

38. The method of claim 6, further comprises treating the low-k film after removing the residue.

39. The method of claim 38, wherein removing the photoresist, removing the residue, and treating the low-k film are performed in one step using the hydrogen gas and water plasma mixture.

40. The method of claim 39, wherein the hydrogen gas is supplied at a flow rate between about 1000 sccm and about 10,000 sccm and the water is supplied at a flow rate between about 10 sccm and about 1000 sccm.

41. The method of claim 39, wherein the plasma is maintained at a temperature between about 150° C. and 450° C.

42. The method of claim 39, wherein the plasma is a downstream plasma.

43. The method of claim 42, wherein the downstream plasma is maintained at a power between about 500 W and 3000 W.

44. The method of claim 39, wherein the low-k film is exposed to the plasma for between about 30 seconds and 180 seconds.

* * * * *

UNITED STATES PATENT AND TRADEMARK OFFICE
CERTIFICATE OF CORRECTION

PATENT NO. : 6,680,164 B2
DATED : January 20, 2004
INVENTOR(S) : Nguyen et al.

It is certified that error appears in the above-identified patent and that said Letters Patent is hereby corrected as shown below:

Column 9,
Line 25, please change "comprise" to -- comprises --.
Line 27, please change "etc" to -- etch --.
Line 41, please change "etc" to -- etch --.

Signed and Sealed this

Third Day of August, 2004

JON W. DUDAS
*Acting Director of the United States Patent and Trademark Office*